US006325636B1

(12) United States Patent
Hipp et al.

(10) Patent No.: US 6,325,636 B1
(45) Date of Patent: Dec. 4, 2001

(54) PASSIVE MIDPLANE FOR COUPLING WEB SERVER PROCESSING CARDS WITH A NETWORK INTERFACE(S)

(75) Inventors: Christopher G. Hipp, Dallas; Guy B. Irving, Carrolton, both of TX (US); David M. Kirkeby, Fullerton; Walter R. Otto, Upland, both of CA (US)

(73) Assignee: RLX Technologies, Inc., The Woodlands, TX (US)

( * ) Notice: Subject to any disclaimer, the term of this patent is extended or adjusted under 35 U.S.C. 154(b) by 0 days.

(21) Appl. No.: 09/625,002

(22) Filed: Jul. 20, 2000

(51) Int. Cl.⁷ .............................. H01R 12/00; H05K 1/00
(52) U.S. Cl. ............................................. 439/61; 361/788
(58) Field of Search ................................ 439/61; 361/788

(56) References Cited

U.S. PATENT DOCUMENTS

| 4,511,950 | * | 4/1985 | Bunner et al. | 361/413 |
| 5,051,096 | * | 9/1991 | Cooke et al. | 439/61 |
| 5,317,477 | * | 5/1994 | Gillett | 361/683 |
| 5,603,044 | * | 2/1997 | Annapareddy et al. | 439/61 |
| 5,682,298 | * | 10/1997 | Raynham | 361/794 |
| 6,046,912 | * | 4/2000 | Leman | 361/784 |
| 6,163,464 | * | 12/2000 | Ishibashi et al. | 361/788 |

* cited by examiner

*Primary Examiner*—Brian Sircus
*Assistant Examiner*—Hae Moon Hyeon
(74) *Attorney, Agent, or Firm*—Baker Botts L.L.P.

(57) ABSTRACT

A midplane printed circuit board having a plurality of first connectors operable to receive a plurality of web server processing cards is provided. A plurality of second connectors operable to receive a plurality of network interface cards may also be provided. Printed circuitry associated with the midplane printed circuit board may operable to couple each first connector with an associate of the plurality of second connectors. A third connector may also be provided operable to receive a first power supply. In accordance with one embodiment of the present invention, the printed circuitry is operable to distribute power from the first power supply to the plurality of first and second connectors.

44 Claims, 9 Drawing Sheets

PASSIVE MIDPLANE FOR COUPLING WEB SERVER PROCESSING CARDS WITH A NETWORK INTERFACE(S)

RELATED APPLICATIONS

The present application is related to co-pending U.S. patent applications: Ser. No. 09/620,105, entitled Single Board Web Server System and Method, filed Jul. 20, 200; Ser. No. 09/620,106, entitled Web Server Network System and Method, filed Jul. 20, 2000; Ser. No. 09/620,409, entitled Data I/O System and Method, filed Jul. 20, 2000; Ser. No. 09/620,107, entitled High Density Web Server Chassis System and Method, filed Jul. 20, 2000; and Ser. No. 09/620,108, entitled Data I/O Management System and Method, filed Jul. 20, 2000.

TECHNICAL FIELD OF THE INVENTION

The present invention relates generally to the field of network servers and, more particularly to a passive midplane system and method.

BACKGROUND OF THE INVENTION

A critical component of both private intranets and the publicly accessible internet is what is commonly referred to as a web server. A web server is typically a computer which is capable of receiving requests for information and returning data or performing specialized processing upon the receipt of a network request for such processing. Conventional network architectures envision servers as large scale computing platforms. For example, large commercial entities may include very large systems acting as web servers fielding requests for processing. Alternatively, these entities might employ large parallel server operations where a multitude of individual server computers all service requests for information and processing in parallel.

In today's network architectures, smaller users such as individuals or small businesses that require server systems will typically be forced to share part of the processing capability of one of these large scale systems. In many cases this sharing of resources does not provide adequate processing capability for the individual or small business user. Further, the sharing of a large processing system means that all parties utilizing that server processing capability are vulnerable to the failure of that system. These large processing platforms are also more difficult to customize if one small user needs specific features or components that other small users do not need. Further, as Internet and intranet traffic have grown, it has become apparent that even the largest processing platforms reach a limit to their processing capability especially in light of the increased traffic in large multimedia content and the necessity for real time processing of transactions.

Another difficulty in providing server technology to individual or small business users is associated with the difficulties in maintaining provisioning and administrating the server technology. Conventional server systems are typically very complex to administer. Software development efforts have not focused on providing simple user interfaces because the typical personnel that are tasked with maintaining servers are typically very sophisticated network technicians.

Large scale servers that are shared by multiple small users present difficulties in monitoring and metering traffic for individual users. For example, if a server provider desired to bill a user of a large scale system according to the processing time or the transaction count that occurred relative to that particular user, it is very difficult to arrive at an accurate assessment of that activity when the server hardware is shared by that user and many other users.

In the past, it has been difficult to provide server capability close to the end user. This is in large part because the typical larger server architectures require special environmental conditions and special hardware environments to supply power and large bandwidth communication links. The environment of a telephone company's central office is typically very close to the end user, however, the space power and environmental constraints within these facilities make it completely impractical to co-locate large server platforms within these facilities.

SUMMARY OF THE INVENTION

The present invention provides a passive midplane system and method that substantially eliminates or reduces the problems and disadvantages associated with previous methods and systems. In particular, a midplane printed circuit board is provided, operable to couple a plurality of web server processing cards, and/or provide power thereto.

In accordance with a particular embodiment of the present invention, a midplane printed circuit board including a plurality of first connectors operable to receive a plurality of web server processing cards, is provided. A plurality of second connectors operable to receive a plurality of network interface parts may also be provided. The midplane printed circuit board may include printed circuitry operable to couple each first connector with an associated of the plurality of second connectors. A third connector may also be provided operable to receive a first power supply. In accordance with a particular embodiment of the present invention, the printed circuitry may be operable to distribute power from the first power supply to the plurality of first and second connectors.

In accordance with another embodiment of the present invention, a fourth connector may be provided, the fourth connector operable to receive a second power supply and wherein the printed circuitry is operable to distribute power from the second power supply to the plurality of first and second connectors.

In accordance with yet another embodiment of the present invention, the printed circuitry may be operable to route data communications between the plurality of first connectors and the second connector.

Technical advantages of the present invention include providing a midplane printed circuit board operable to couple a plurality of web server processing cards with at least one network interface card.

Another technical advantage of the present invention includes providing a midplane printed circuit board operable to distribute data communications between the plurality of web server processing cards and the network interface card.

Yet another technical advantage of the present invention includes providing a midplane printed circuit board which distributes power to the web server processing cards and/or the network interface card.

Still another technical advantage of the present invention includes providing a midplane printed circuit board operable to couple a plurality of network interface cards.

Other technical advantages will be readily apparent to one skilled in the art from the following figures, description, and claims.

BRIEF DESCRIPTION OF THE DRAWINGS

For a more complete understanding of the present invention and its advantages, reference is now made to the following description, taken in conjunction with the accompanying drawings, in which.

DETAILED DESCRIPTION OF THE DRAWINGS

Figure 1:
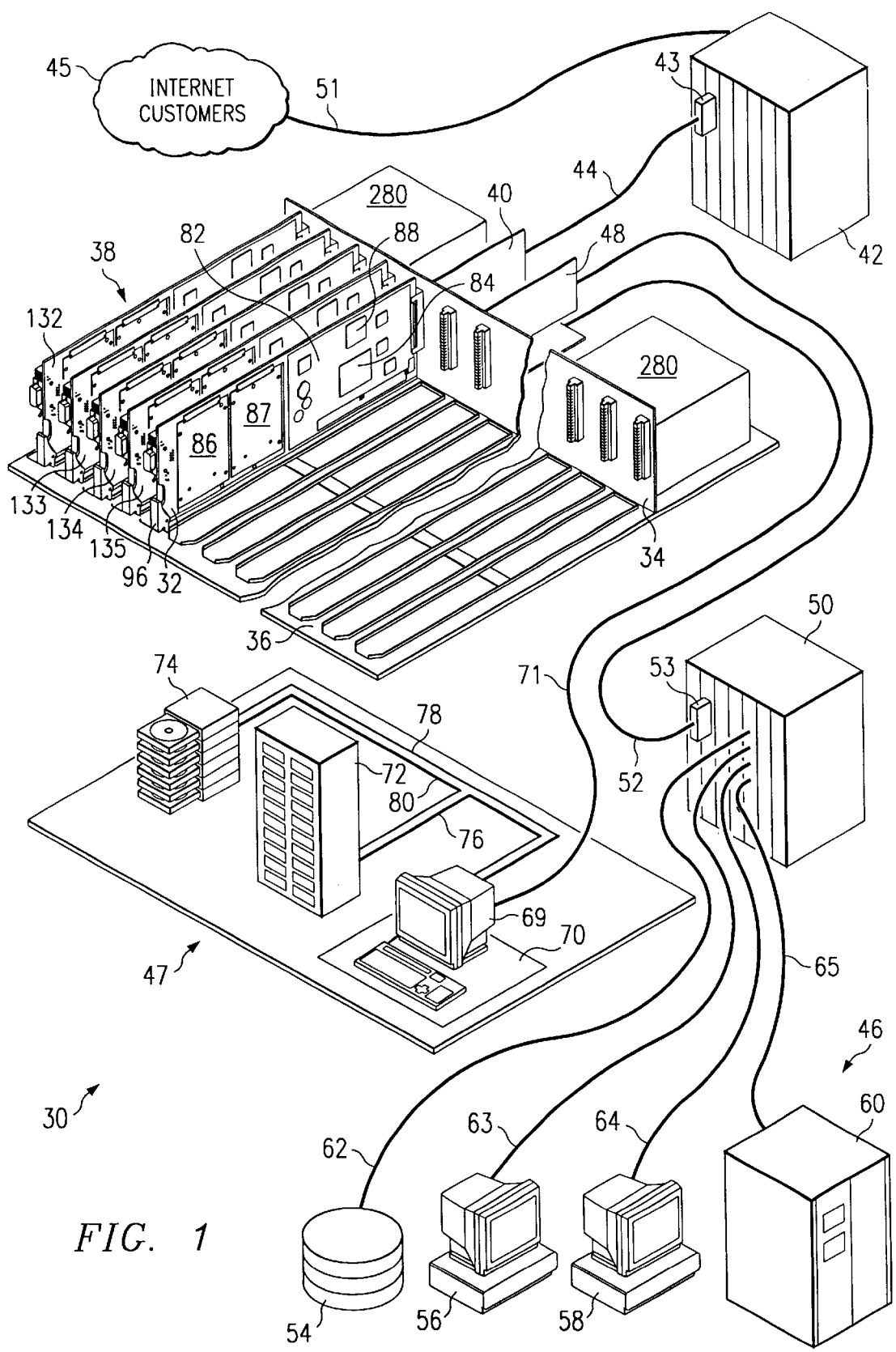
FIG. 1 is a schematic drawing illustrating a plurality of web server processing cards coupled with a public network, a private network, and a management network, in accordance with one embodiment of the present invention.

Referring to FIG. 1, a high density, multiple server network of the present invention is illustrated and generally designated by the reference number 30. Network 30 includes a plurality of web server processing cards 32 and 132–135 coupled with a public network 45, a private network 46 and a management network 47. Each web server processing card 32 and 132–135 are configured and function similarly. Therefore, web server processing card 32 will be described in detail, for illustrative purposes. However, all web server processing cards described within this specification may include all components and functionality described with regard to web server processing card 32.

Web server processing card 32 provides the functionality of a single board computer which may be employed as a rack mounted web server. Networks 45, 46 and 47 may be configured, maintained and operated independently of one another, and cooperate to provide distributed functionality of network 30.

Each web server processing card 32 is coupled with a passive midplane 34 which is coupled with a base 36 of a server chassis 38. Additional components regarding web server chassis 38 are illustrated and described with respect to FIG. 10. A network interface card 40 couples passive midplane 34, and therefore web server processing cards 32 with a public network switch 42, via communication links 44. Throughout this specification, the term "switch" may be used to indicate any switch, router, bridge, hub or other data/communication transfer point. Public switch 42 distributes data between web server processing cards 32 and public network 45. In a particular embodiment, public network 45 may include the Internet. Public network 45 may include a variety of networks including, without limitation, local area networks (LANs), wide area networks (WANs), and/or Metropolitan Area Networks (MANs).

A second network interface card 48 is coupled with passive midplane 34 and distributes data to a private network switch 50 via communication link 52. A plurality of private network applications including a storage server 54, application server 56, database server 58, and legacy systems 60 are coupled with private network switch 50 through communication links 62, 63, 64 and 65, respectively.

Figure 7:
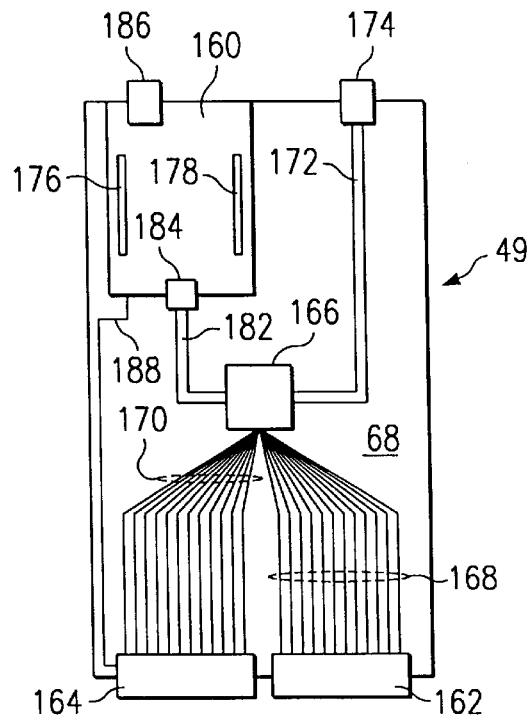
FIG. 7 is a plan view taken from above, illustrating yet another alternative embodiment network interface card.

A management network interface 49, which is illustrated in more detail in FIG. 7, distributes data between passive midplane 34 and remote management system 70 of management network 47, through communication link 71. One or more online/nearline memory storage devices, including non-volatile storage device 72 and secondary non-volatile storage device 74 communicate with management console 70 using communication links 76 and 78, respectively. Memory storage devices 72 and 74 communicate with one another through communication link 80.

Public Network

In the illustrated embodiment public network switch 42 includes a Cisco Catalyst 5500, an industry standard Ethernet switch. Alternatively, a Black Diamond public switch, as manufactured by Extreme Networks may be provided as public switch 42.

A high density connector 43 may be coupled with public switch 42 to facilitate communication between public switch 42 and communications link 44. In one embodiment, high density connector 43 may include an RJ-21 high density telco (telephone company) type connector for consolidating at least twelve 10/100/1000 megabits per second Ethernet connections through a single cable. The use of high density telco style connectors, like high density connector 43 allows the consolidation of twelve, twenty-four or forty-eight Ethernet connections, at a twelve to one ratio, through a single cable.

Communication link 44 is operable to provide gigabit Ethernet over fiber. In another embodiment, communication link 44 may include gigabit Ethernet over copper. The coupling between public switch 42 and network interface card 40 may be accomplished using a single communication link 44. However, in another embodiment a second communication link 44 may be provided to accomplish a redundant configuration. This allows a back-up communication link between public switch 42 and network interface card 40, in case of failure of the primary communication link. Accordingly, redundant fiber connections to public switch 42 or other high density data center switches capable of aggregating hundreds of gigabit connections in a single switch 42, are provided.

Public switch 42 is coupled with public network 45 over communications link 51. In a particular embodiment, communication link 51 may include a high bandwidth transport, for example and without limitation T3 or OC48, in order to serve a plurality of servers on an internet service provider (ISP) or application service provider (ASP) network.

Private Network

Similar to public network switch 42, private network switch 50 may also include either a Catalyst 5500, as manufactured by Cisco, or a Black Diamond, as manufactured by Extreme Networks. A high density connector 53 may be provided to facilitate communication between private network switch 50 and communications link 52, and ultimately, network interface card 48. In a particular embodiment, high density connector 53 may include an RJ-21 high density telco type connector for consolidating at least twelve 10/100/1000 megabits per second Ethernet connections through a single cable. As previously described, the use of high density telco style connectors, like high density connector 53 allows the consolidation of twelve, twenty-four or forty-eight Ethernet connections at a twelve to one ratio, through a single cable.

High density connectors, for example 43 and 53, facilitate the consolidation of 10/100/1000 megabits per second Ethernet cabling for large numbers of web server processing cards. Accordingly, private switch network switch 50 is cable of aggregating forty-eight or more 10/100/1000 megabits per second Ethernet ports in a single network interface card, and seven hundred sixty-eight ports (web server processing cards) in a single private network switch.

Private network switch 50 is coupled with a plurality of "back office" network applications including storage server 54, applications server 56, database server 58 and legacy systems 60. Storage server 54 provides mass storage to support web server processing cards of various users. This is a private connection because server 54 is not linked directly to public network 45. Throughout this specification, "back office" will be used to indicate operations, management and support tasks used to support the operation of web server processing cards, which are accomplished at remote locations from server chassis 38. Communication links 62–65 provide private 10/100/1000 megabits per second Ethernet supporting various high volume business transaction processing systems (HVBTPS). Storage server 54 provides network attached storage (NAS). Application server 56 may be rented, or provided by an application service provider (ASP). Database server 58 provides transaction processing, and legacy systems 60 may include various database servers, etc. . . .

Private network 46 is considered "private," because there is no physical connection between private network 46 and public network 45. Accordingly, security is provided to data and communications of private network 46 because private network 46 is protected from a security breach initiated from public network 45.

Private network 46 may be configured to provide a plurality of "back-end" network applications. For example, private network 46 may provide end users with secure internet voicemail, internet fax, a "personal" web server, electronic mail accounts, MP-3 servers and/or digital photo collection servers.

In another embodiment, private network 46 may be configured to provide groupware and other associated applications. For example, private network 46 may include the necessary hardware and software to provide users of network 30 with "chat rooms" and other on-line meeting applications. Wireless Application Protocols (WAPs) applications may also be provided. In fact, the WAP applications may be synchronized to groupware associated with the web server processing cards.

Management Network

Remote management system 70 of management network 47 includes the ability to monitor, manage, back-up, restore, activate and operate many of the components of high density server network 30. For example, an operator of a remote management system 70 can control all of the functions and operations of web server processing cards 32. In fact, remote management system 70 includes control software and other applications which accomplish these functions and operations automatically, without operator intervention. Many of the software and other applications which may reside upon remote management system 70 will be described later, in more detail.

In a particular embodiment, remote management system 70 performs metering, including without limitation packet level metering, and bandwidth monitoring of web server processing cards 32. Other characteristics and measurements which remote management system 70 collects, evaluates and stores include operating data and other information regarding web server processing cards 32.

Remote management system 70 identifies each web server processing card 32 according to at least two identifiers. For example, during start-up of each web server processing card 32, remote management system 70 is informed of a hardware address associated with each web server processing card 32. The hardware address is analogous to the IP address assigned by the server to each client, in a client/server network system. The hardware address of each web server processing card 32 may be referred to as the "logical" address of a particular web server processing card.

Also during the startup of web server processing cards 32, remote management system 70 is informed of a chassis/slot address identifier unique to each web server processing card 32. The chassis/slot address may also be referred to as the physical identifier, or physical address of a particular web server processing card. The physical address allows remote management system 70 to identify a particular web server processing card 32 in a manner which is more readily identifiable to an operator of remote management system 70 or other user of server network 30.

Remote management system 70, non-volatile storage device 72 and secondary non-volatile storage device 74 also provide in-line/near-line storage support for web server processing cards 32. Storage devices 72 and 74 may include high capacity redundant array of inexpensive disks (RAID)/optical/tape subsystem controlled by hierarchical storage management software which enables automatic back-up and restoration of user data from all servers via remote management system 70.

Remote management system 70 has the ability to provide a single point of management for thousands of servers. The servers under the control of remote management system 70 may include thousands of web server processing cards 32. These servers may be configured to provide individual server capacity. In another embodiment, the servers may be "clustered." In other words a plurality of web server processing cards 32 may be joined logically in order to provide a sealed level of service to a user.

Accordingly, remote management system 70 provides management functionality over a private, back end network, which may include thousands of web servers. In a particular embodiment, software associated with remote management system 70 may be installed upon a high capacity Linux server or workstation with enough storage capacity to provide back-up functionality to all servers on any particular network.

Management software, applications and functionality associated with remote management system 70 typically reside on a server. However, remote management system 70 may be accessed remotely by various electronic devices including laptops, desktops and handheld personal digital assistants ("PDAs"). Devices used to access remote management system 70 may also include a secure web browser or other security applications.

A web browser based, graphical user interface 69 associated with remote management system 70 provides the operator of management network 47 with a user-friendly, easy to read overview of operational functions in graphical formats, suitable for "at a glance" monitoring and diagnosis.

As will be described later in more detail, remote management system 70 includes various software, applications and functionality which simplify and improve the operation of associated web servers, including without limitation web server processing cards 32. For example, remote management system 70 provides "automated preemptive failover" functionality. Automated preemptive failover includes an automated system which monitors and predicts component failures, issues notification to the network operator or administrator and initiates fail-over to a "warm spare" before catastrophic failures occur, without much, if any user intervention.

Remote management system 70, along with storage devices 72 and 74 provide automated back-up of client data for automated restoration of a web server processing card, or a spare web server processing card to its original state, in the event of a failure.

In a particular embodiment, a software agent residing upon remote management system 70 may be used to collect, store, and analyze measurements and data regarding hardware, software and bandwidth usage measurements for billing purposes. These measurements and data may be exported to a variety of applications including data mining and decision support systems.

Remote management system 70 provides the functionality of a browser-based user administrative graphical user interface. This includes an intuitive user interface for controlling basic functionality of servers on a single server level. Accordingly, a network operator or administrator may add, delete, configure or modify virtual servers and/or web server processing cards 32. Similarly, remote management system 70 may be used to add, delete, configure and modify users who are granted access to web server processing cards 32 of public network 45. Remote management system 70 also provides operations, administration, management and provisioning (OAM&P) functionality to the network administrator. Traffic metering and measurement (TM&M) and performance measurements are also collected, stored, analyzed and maintained by remote management system 70.

Figure 2:
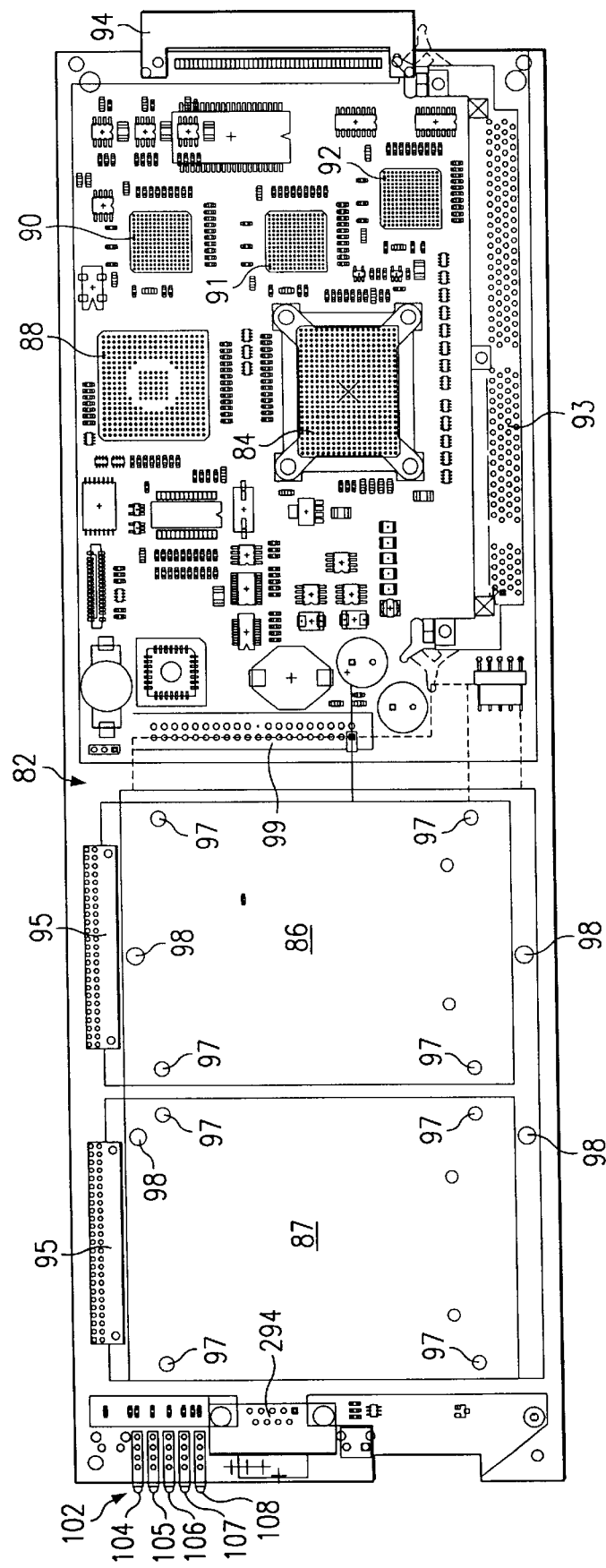
FIG. 2 is a plan view taken from above, with portions broken away, illustrating a web server processing card.
Figure 3:
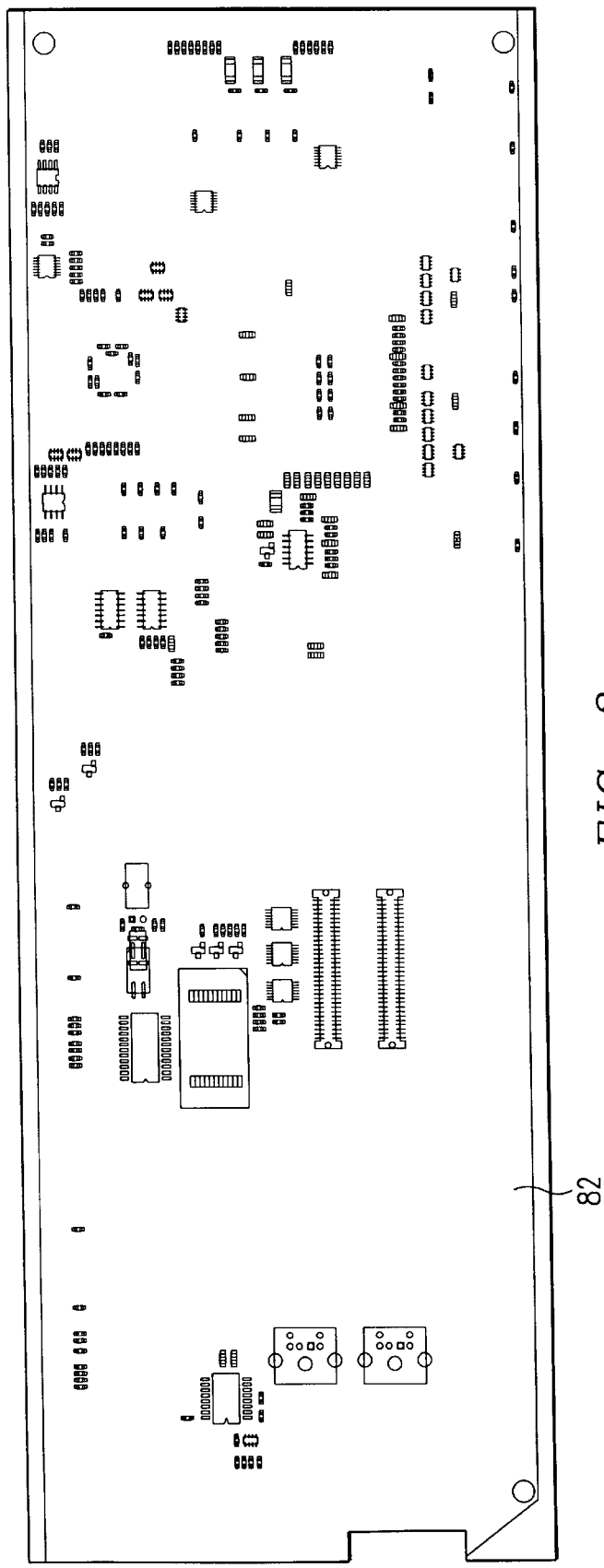
FIG. 3 is a plan view taken from below, with portions broken away, illustrating the web server processing card of FIG. 2.

Similar to private network 46, management network 47 is considered a "private" network. Since there is no physical connection between management network 47 and public network 45, management network 47 is protected from a security breach initiated from public network 45. Web Server Processing Cards Referring now to FIGS. 1–3, web server processing card 32 will be described in more detail. Web server processing card 32 is a single board computer upon which all of the requisite components and devices are mounted to enable processing card 32 to function and operate as a server hosting a wide array of Internet-based applications. Each web server processing card 32 within a particular chassis 38, share a common passive midplane 34 through which all power and connectivity passes. Server chassis 38 is intended for rack mount in server rack 39 (See FIG. 13), and includes passive midplane 34 and all the associated web server processing cards 32.

In one embodiment, web server processing card 32 includes a powerful computer connected to the Internet and operable to store audio, video, data graphics and/or text files in order to display to a user of public network 46 via protocols including, without limitation, hypertext transfer protocol (http). Each web server processing card 32 includes a printed circuit board 82, coupled with a central processing unit (CPU) 84, a disk drive 86, a dynamic memory integrated circuit 88, and network interface integrated circuitry 90–92.

Central processing unit 84 performs the logic, computational and decision making functions of processing card 32. Many types of central processing units with various specifications may be used within the teachings of the present invention. In the illustrated embodiment, CPU 84 includes a Crusoe 667 MHz CPU, as manufactured by Transmeta. In fact, many central processing units with comparable processing power to a 500 MHz, Pentium III, as manufactured by Intel, may be used within the teachings of the present invention. For example, the Crusoe TM 3200 with speeds in the range of 300–400 MHz, or TM 5400 with speeds in the range of 500–700 MHz, may also be used.

The clock speed of central processing unit 84 will depend in part upon the operating system resident upon web server processing card 32. In the illustrated embodiment, web server processing card 32 includes a version of the Linux operating system. The clock speed of central processing unit 84 may diminish by as much as twenty percent if a version of the Windows operating system is substituted for the Linux operating system.

CPU 84 of the present invention may include the ability to adapt its processing speed to the processing load placed upon it. In other words, CPU 84 may vary its speed as appropriate to handle any given processing load, whereas many other processors simply include ON or OFF capabilities. The CPU of the present invention preferably includes a maximum continuous power consumption of no more than 4.5 watts, and a maximum operating temperature of below 150 degrees Fahrenheit.

In the illustrated embodiment, the maximum operating temperature of CPU 84 is approximately 120° Fahrenheit. Due to its variable speed feature CPU 84 of the present invention will typically consume significantly less than 4.5 watts of power. CPU 84 of the illustrated embodiment is compatible with the Intel instruction set such that CPU 84 supports standard X86 operating system.

Disk drive 86 includes electronics, motors, and other devices operable to store (write) and retrieve (read) data on a disk. In the illustrated embodiment, disk drive 86 includes a two and one-half inch IBM 9.5 mm notebook hard drive. A second two and one-half inch disk drive 87 may be installed upon a given web server processing card 32. The use of disk drive 87 is optional, and increases the capacity and functionality of web server processing card 32.

A plurality of hardware connectors 97 are provided upon printed circuit board 82, to allow for the installation of up to two, two and one-half inch disk drives. For example, communications ports 95 are affixed to printed circuit board 82, to allow for the installation of disk drives 86 and/or 87. Each disk drive 86 and 87 is also affixed to printed circuit board 82, using connectors 97.

The use of web server processing card 32 having two, two and one-half inch disk drives allows for the installation of three hundred and thirty-six servers within an industry standard rack having 42U of usable interior space (standard industry rack). For purposes of this specification, a standard industry rack has the approximate dimensions nineteen inches wide by six feet high by thirty to thirty-four inches deep.

Furthermore, at least two, 6 to 25 gigabyte—two and one-half inch hard drives may be provided with web server processing card 32, in accordance with the teachings of the present invention. Alternatively, a 10 to 75 gigabyte, three and one-half inch hard drive may be installed upon web server processing card 32, in lieu of two and one-half inch drives 86 and 87. Many other hard drives are suitable for use within the teachings of the present invention. In fact, many hard drives having a maximum operating temperature of 125 degrees Fahrenheit and a maximum continuous power output of 2.5 watts may be substituted for disk drive 86 of the present invention. Accordingly, a plurality of configurations for web server processing cards 32 are envisioned within the teachings of the present invention.

In another embodiment, each web server processing card 32 is equipped with a single, three and one-half inch disk drive, which offers greater spindle speed and product life. Alternatively, two and one-half inch disk drives provide greater density and lower power requirements. In a particular embodiment, the three and one-half inch disk drive may include an IBM DeskStar or the two and one-half inch disk drives may include an IBM TravelStar hard drive. A total of one hundred and sixty-eight web server processing cards having a three and one-half inch disk drive may be mounted in a standard industry rack. In a particular embodiment, for efficiency purposes, each web server processing card may be based upon the same motherboard design, regardless of the number and size of the associated disk drives provided with the web server processing card.

Web server processing card 32 also includes a dynamic memory integrated circuit, or memory 88. Memory 88 includes a dual in-line memory module ("DIMM"), to provide the appropriate speed and bandwidth for network communication. In a particular embodiment, memory 88 includes a one hundred and sixty-eight pin connector.

The storage capacity of memory 88 may be approximately 64 MB RAM, or greater.

Three interface integrated circuit chip sets 90, 91 and 92 are coupled with printed circuit board 82. Chip set 90 may be referred to as public network interface integrated circuit since it corresponds with the operation of the public network. Similarly, chip set 91 may be referred to as the private network interface integrated circuit and chip set 92 may be referred to as the management network interface integrated circuit since they correspond to the private network and management network operations, respectively. Collectively, chip sets 90, 91 and 92 provide three 10/100/1000 megabits per second Ethernet network interfaces. Additional chip sets may be included with web server processing card 32 in order to support more than three independent networks.

Chip sets 90, 91, and 92 include "auto sensing" capability from ten megabytes and higher, such that they may operate anywhere within the range of 10/100 Ethernet to gigabit Ethernet. Accordingly, each web server processing card 32 may come equipped with three, 10/100 BaseT network interfaces, one to support public network 45, one to support private network 46, and one to support management network 47. Each chip set 90, 91 and 92 also includes "boot from LAN" capability. Wake on LAN refers to the ability of a chipset which is not experiencing network traffic to remain idle until a request and/or traffic is received from the associated network. This feature significantly reduces the power consumption associated with chipsets 90, 91 and 92, and ultimately web server processing card 32.

Figure 8:
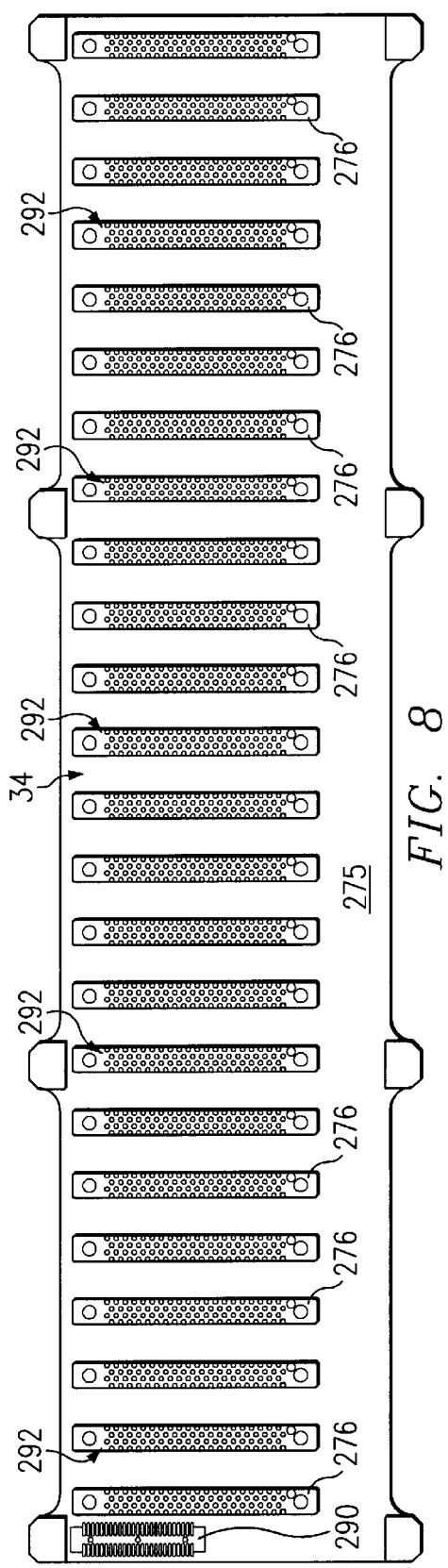
FIG. 8 is an elevation view illustrating a front portion of a passive midplane, in accordance with one embodiment of the present invention.

A high density, 80 pin SCA connector 94 is used to couple web server processing card 32 with a corresponding high density, 80 pin SCA connector 276 associated with passive midplane 276 (see FIG. 8). Connector 94 includes a "blind mate" feature which provides self-alignment properties for simplified installation and removal of processing card 32 from passive midplane 34. Connectors 94 and 276 also include built-in serial connectors for managing network traffic. In other words, connector 94 and 276 are appropriately sized and configured to accommodate a serial connection independent of the above referenced Ethernet connections and any other required power/communications ports.

The installation and removal of web server processing card 32 from passive midplane 34 may be accomplished using ejector levers 96. Levers 96 facilitate zero force insertion of connector 94 within connector 276. The proper mechanical connection between connectors 94 and 276 may be verified by an operator of network 30, using the relative location and orientation of ejector levers 96.

Status and operation module 102 provides a user interface for determining the status and configuring web server processing cards 32. A plurality of LED indicator lights 104–108 are included with status and operation module 102. LED 104 indicates pass/fail, LED 105 indicates hard disk activity and LEDs 106–108 each indicate activity regarding an associated LAN. Server reset button 112 is also coupled with status and operation module 102, and may be used to accomplish a "hard" local reset of the associated processing card 32.

A password reset button 114 is provided upon status and operation module 102 and may be used to locally reset the administrative password. In other words, password reset button 114 may be used to erase the existing administrative password such that an operator of network 30 may redefine the administrative password.

A dual in-line memory module (DIMM) connector 93 is also provided upon web server processing card 32. In the illustrated embodiment, DIMM connector 93 includes a multiple pin connector. The size and configuration of DIMM connector 93 may be significantly altered, within the teaching of the present invention. DIMM connector 93 facilitates the installation of a dual in-line memory module(s) DIMM (s). Accordingly, web server processing card 32 can accommodate significantly more bandwidth than traditional systems which incorporate a single in-line memory module (SIMM).

Web server processing card 32 also includes a custom Basic Input/Output System ("BIOS") which contains the appropriate instructions for sending information from a program to the appropriate hardware device within network 30. The BIOS of the illustrated embodiment is capable of supporting at least three independent networks, i.e., public network 45, private network 46, and management network 47. The BIOS is also configured to support the "wake on LAN" capability described above. Many of the other components of web server processing card 32 are similar in structure and function to a typical motherboard, although support for video, keyboard and a mouse may be removed. Each web server processing card 32 may include two megabytes of flash read-only-memory (ROM) for BIOS storage.

Each web server processing card 32 includes the appropriate hardware and software to facilitate plug-n-play capability for web server processing cards 32. All of the components necessary for the operation of a web server processing card 32 are mounted upon a single printed circuit board. Accordingly, an unsophisticated user or operator of network 30 may install, remove and/or replace a web server processing card in a single step.

In a particular embodiment, each web server processing card 32 may include a battery backed-up real time clock.

In the illustrated embodiment, each web server processing card 32 is configured to operate at "low power." In this context, low power refers to a web server processing having a performance standard exceeding 0.5 BIPS/WATTS.

As described above, web server processing card 32 may include a three and one-half inch disk drive, in lieu of disk drives 86 and 87. Accordingly, printed circuit board 82 includes the appropriate hardware to accommodate the three and one-half inch drive. For example, a plurality of connectors 98 are provided to accommodate a three and one-half inch disk drive. Also, a communications port 99 is provided to facilitate the incorporation of the three and one-half inch disk drive. These "future" connectors are optional, as web server processing card 32 may be provided without appropriate connectors to accommodate the three and one-half inch disk drive.

Printed circuit board 82 includes printed circuitry operable to detect the location and presence of any disk drive(s) installed upon printed circuit board 82. For example, web server processing card 32 includes three communications ports 95(x2) and 99. When one or more disk drives are installed in communications ports 95 and/or 99, printed circuit board 82 automatically detects the presence and exact port location of the disk drives. This allows web server processing card 32 to route data/communications traffic according to the specific configuration of disk drive(s) present.

As previously described, each web server processing card may have either a three and one-half inch disk drive installed, a two and one-half disk drive, or two, two and one-half inch disk drives installed. Standard three and one-half inch disk drives use primarily 12 volt power and standard two and one-half inch disk drives use 5 volt power. Accordingly, 5 and 12 volt loading by each web server processing card may be very different depending on the type and/or size of disk drives installed. In previous web servers, the variation in loading between the 5 and 12 volt supplies would have required the use of different power supplies depending on the type of disk drives installed, or the use of much larger power supplies to compensate for the wide variation in 5 and 12 volt loading. In addition, mixing web servers with two and one-half inch disk drives with web servers with three and one-half inch disk drives, in a single system, was difficult.

Web server processing cards 32 eliminate these problems by balancing to some degree the loading on the 5 and 12 volt supplies as follows:

The input power to a CPU DC to DC converter, installed upon web server processing card 32, is 12 volts when a two and one-half inch disk drive is installed.

The input power to the CPU DC to DC converter is 5 volts when a three and one-half inch disk drive is installed.

The input power for the CPU DC to DC converter is controlled by a disk drive power cable and is automatically configured when the appropriate cable is installed. Accordingly, web server processing card 32 includes the ability to detect which type/size of disk drive is installed, and change the voltage provided to the DC to DC converter, based upon the disk drive(s) present.

This technique ensures that the power source for the CPU DC to DC converter will be properly configured because the assembly process of disk drive installation causes the DC to DC converter power source to be configured properly and no additional configuration steps are required.

Network Interface Cards

Figure 4:
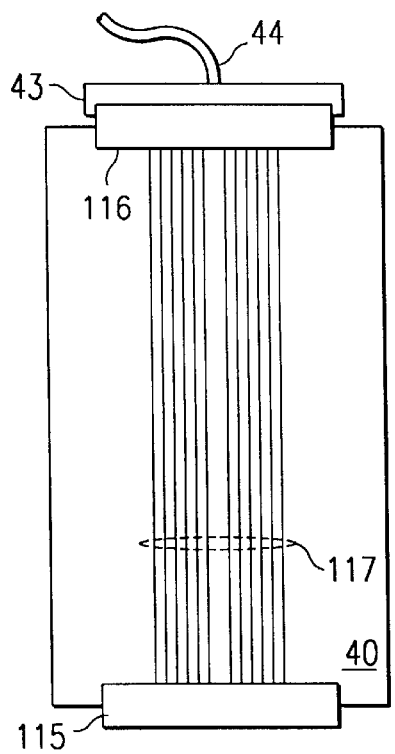
FIG. 4 is a plan view taken from above, illustrating a network interface card in accordance with one embodiment of the present invention.

Public network interface card 40 is illustrated in more detail in FIG. 4. Each network interface card 40 may support up to twelve independent web server processing cards 32. In one embodiment, network interface card 40 may include twelve independent Ethernet communication paths 117 between a front connector 115 and rear connector 116. In this embodiment, network interface card 40 provides modular connectivity, such that an operator of network 30 may access rear connector 116 at a convenient location upon server chassis 38. Accordingly, a standard RJ-21 connector coupled with communication link 44 may be connected with rear connector 116 in order to distribute data between network interface cards 40, corresponding web server processing cards 32, and public network switch 42. In the illustrated embodiment of FIG. 4, communication link 44 may include twelve groups of two twisted pair category 5 cable, for a total of twenty-four different Ethernet connections, or forty-eight wires total. The connection between public network switch 42 and network interface card 40 may be accomplished with high density Ethernet connectors. In another embodiment, integrated 10/100/1000 switches may be incorporated using octopus cables which "fan-out" from a high density connector to multiple RJ-45 connectors.

Rear connector 116 is appropriately sized to handle network traffic for up to twelve web server processing cards 32. Since each Ethernet communication link includes two twisted pairs, rear connector 116 is configured to receive up to forty-eight individual wires.

Figure 5:
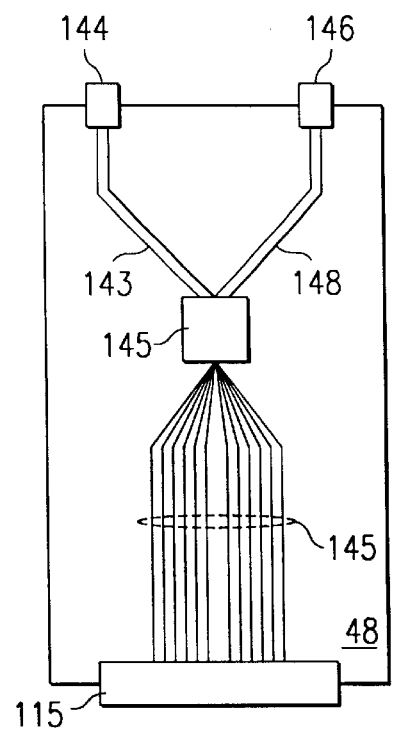
FIG. 5 is a plan view taken from above with portions broken away, illustrating an alternative embodiment network interface.

In another embodiment, a switched network interface card 48 may be used in lieu of network interface card 40 to establish the connection between a respective web server processing card 32 and public network switch 42. Switched network interface card 48 is illustrated in more detail in FIG. 5. Similar to network interface card 40, switch network interface card 48 includes an eighty pin SCA connector 115, which couples network interface card 48 with passive midplane 34. Each Ethernet communication path 145 associated with switched network interface card 48 terminates at a switch chip 145. Switch chip 145 monitors and distributes traffic from a respective web server processing card 32 to a corresponding RJ-45 Ethernet connector 144 through an Ethernet communication link 143. In a particular embodiment, switch chip 145 may include an optional twelve or twenty-four port 10/100 Base T switch with fiber gigabit uplinks. In another embodiment, switch chip 145 may include an optional twelve or twenty-four port 10/100 Base T switch with copper gigabit uplinks.

A redundant configuration may also be included having a second RJ-45 connector 146 and Ethernet communication link 148. This provides the network operator with the ability to include redundant communication links 44 in separate physical locations, for emergency operation in the event of a failure of one of the communications systems.

As illustrated in FIG. 1, private network interface card 48 may be used to establish connectivity between corresponding web server processing cards 32 and private network switch 50. In another embodiment, interface card 48 may be configured similarly to public network interface card 40. Accordingly, either the straight pass-through configuration of network interface card 40 or the switched pass-through configuration of network interface card 48 may be used for private network interface card 48 and/or public network interface card 40.

Figure 6:
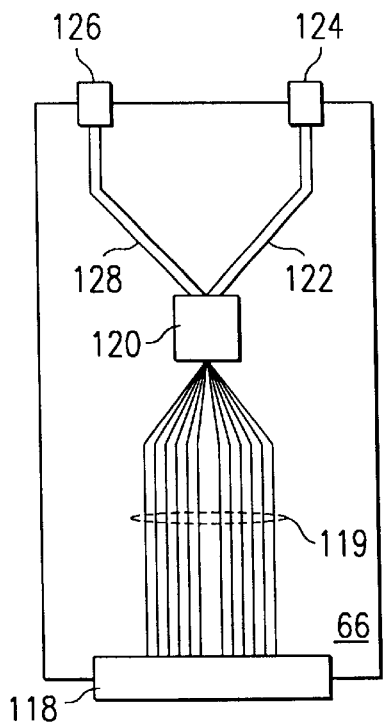
FIG. 6 is a plan view taken from above, illustrating another alternative embodiment network interface card.

The configuration and operation of an alternative embodiment network interface card 66 is illustrated in more detail in FIG. 6. Network interface card 66 includes an eighty pin SCA connector 118 in order to couple management network interface card 66 with passive mid-plane 34. Ethernet communication links 119 distribute data between a respective web-server processing card 32 and a hub chip 120. A communication link 122 provides a communication path between hub chip 120 and an RJ-45 connector 124. Accordingly, communication link 71 (FIG. 1) may be coupled with RJ-45 connector 124 in order to distribute data between management network interface card 68 and management console 70.

A second RJ-45 connector 126 may be coupled with hub chip 120 through a communication link 128. RJ-45 connector 126 provides the network operator with the ability to "daisy-chain" management network interface cards from a plurality of web server chassis 38. Accordingly, RJ-45 connector 126 is useful when multiple web server chassis are employed in a single network, and daisy-chain ability is desired. In another embodiment, RJ-45 connector 126 may be used to provide a redundant communication path between management console 70 and interface card 68.

Hub chip 120 consolidates management network traffic from corresponding web server processing cards 32, for distribution throughout the network. In a particular embodiment, hub chip 120 may include an integrated network hub, for example a sixteen port repeater chip integrated upon interface card 66 for aggregating all management communications through a single 10/100/1000 megabits per second Ethernet connection. Hub chip 120 may be referred to as a repeater because it broadcasts, or repeats every message it receives to all ports of the management network. In another embodiment, hub chip 120 may be replaced with a switch chip which would provide the ability to address and distribute messages according to a packet header, to the appropriate port within the management network.

In a particular embodiment, a hub chip may be employed, in lieu of a switch chip, at the network interface card due to its reduced cost, and simplified operation. In one embodiment, RJ-45 connectors 124, 126, 144 and 146 may include gigabit RJ-45 connectors. In another embodiment connectors 124, 126, 144 and 146 may be replaced with fiber optic or copper gigabit interface connectors ("GBIC").

Referring now to FIG. 7, management network interface 49 is illustrated in more detail. Management network interface 49 includes a single board computer 160, coupled with management network interface card 68.

Single board computer 160 may also be referred to as a "daughter card" to management network interface card 68.

Single board computer 160 includes similar hardware and components to web server processing card 32, except single board computer 160 does not include a disk drive.

Conversely, web server processing card 32 includes disk drive 86.

Management network interface card 68 includes a pair of high density connectors 162 and 164. Each high density connector 162 and 164 includes at least twelve Ethernet connectors, a serial port, and a power interface. In a particular embodiment, the serial port associated with each high density connector 162 and 164 includes an I²C bus.

The power interface associated with each high density connector 162 and 164 is configured to provide 3.3, or 5.0 volt power source to management network interface 49. Accordingly, power may be distributed to various components of management network interface 49, including single board computer 160, and a hub chip 166.

The twelve Ethernet connectors, associated with each high density connector 162 and 164, enable each high density connector 162 and 164 to interface with twelve web server processing cards. Accordingly, in the illustrated embodiment, each management network interface can collect, interpret and manage communications and data transfer with twenty-four web server processing cards.

Twelve Ethernet connectors 168 are used to couple high density connector 162 with hub chip 166. Similarly, twelve Ethernet connectors 170 are used to couple high density connector 164 with hub chip 166. Hub chip 166 consolidates management network traffic from up to twenty-four web server processing cards, for distribution to single board computer 160 and/or throughout network 30. In another embodiment, a switch chip may be used in lieu of hub chip 166 in order to provide management network interface 49 with the ability to selectively switch and distribute network management information rather than simply broadcasting all messages received to every node coupled with management network interface 49.

A communications link 172 distributes data between hub chip 166 and an Ethernet connector 174. Accordingly, Ethernet connector 174 may be coupled with remote management system 70, of management network 47. In a particular embodiment, management network interface 49 may be provided without single board computer 160. In this embodiment, communication between web server processing cards 32 and remote management system 70 may be conducted according to the preceding description.

In another embodiment, single board computer 160 may be provided with management network interface 49, or management network interface 49 may be upgraded in the future to include single board computer 160. Accordingly, connectors 176 and 178 are typically provided upon management network interface card 48, to facilitate the installation of single board computer 160.

A communication link 182 couples hub chip 166 with an Ethernet connector 184 associated with single board computer 160. Accordingly, when properly installed, single board computer 160 receives all broadcast signals which are received by hub chip 166. Single board computer 160 collects, stores, calculates, analyzes and communicates this information to remote management system 70 and/or other components of high density server network 30. Communication between single board computer 160 and remote management system 70 occurs via Ethernet connector 186.

When single board computer 160 and its associated Ethernet connector 186 are present upon management network interface 49, Ethernet connector 174 is no longer required to communicate with remote management system 70. However, in the event of a failure of single board computer 160 and/or its associated components, including without limitation Ethernet connector 186, Ethernet connector 174 provides an alternative path of communication between management network interface 49 and remote management console 170. In an alternative embodiment, Ethernet connector 174 may be omitted from management network interface 49.

Connectors 174 and 186 provide the network operator with the ability to "daisy-chain" management network interface 49 with a plurality of additional components of network 30, for example, additional management network interfaces associated with other server chassis 38. Accordingly, connectors 174 and 186 are useful when multiple web server chassis are employed in a single network, and daisy-chain ability is desired. In another embodiment, connectors 174 and 186 may be used to provide a redundant communication path between management console 70 and interface 49.

In the illustrated embodiment, another communications link 188 is provided in order to couple single board computer 160 and high density connector 164. Communication link 188 may include an I2C bus coupled with the serial port associated with high density connector 164. Another I2C bus may also be provided between single board computer 160 and the serial port associated with high density connector 162. As will be described later in more detail, the direct serial connection between single board computer 160 and high density connector 164 allows single board computer 160 to execute a hardware reset, software reset, or password reset upon any particular web server processing card with which high density connector 164 is coupled.

Management network interface 40 includes the ability to perform a hardware reset of any particular web server processing card. Management network interface 40 also includes the ability to perform software resets of various components of network 30. In a particular embodiment, single board computer 160 collects telemetry data regarding the use, performance and operation of many components of each web server processing card 32, which will be described later in more detail. Such data may be stored within single board computer 160 and/or forwarded to remote management system 70, for further processing.

Passive Midplane

Figure 9:
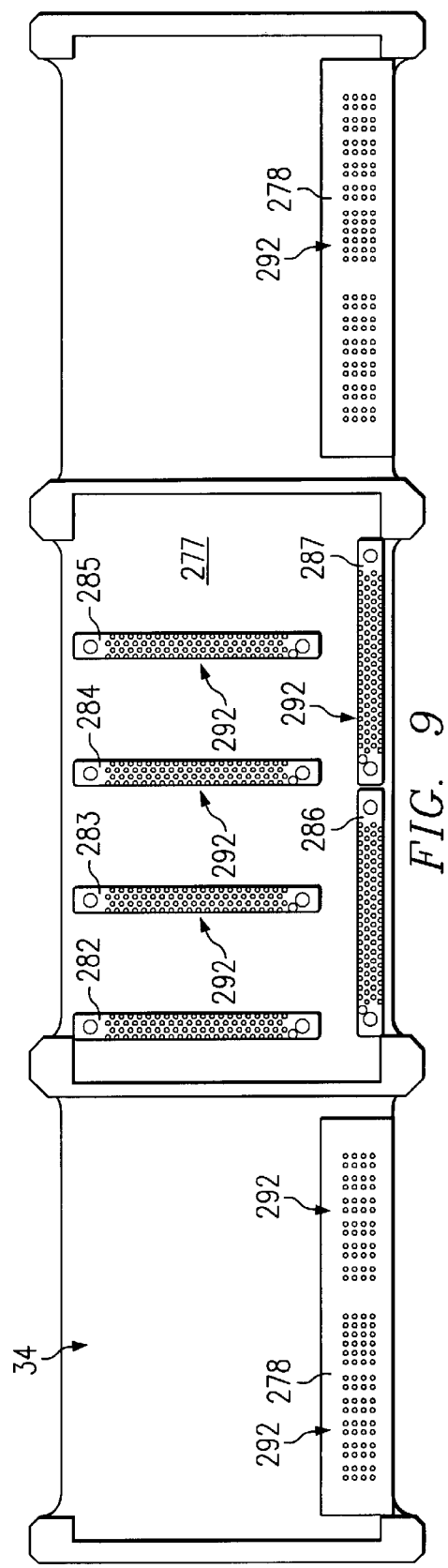
FIG. 9 is an elevation view, illustrating a rear portion of the passive midplane of FIG. 8.

Referring now to FIGS. 8 and 9, passive midplane 34 is illustrated in more detail. On its front face 275, passive midplane 34 includes a plurality of web server processing card connectors 276 which facilitate the installation of up to twenty-four web server processing cards 32. Rear face 277 of passive midplane 34 includes a pair of power supply mounting mechanisms 278 which accommodate power supplies 280, which will be described later in more detail. Rear face 277 of passive midplane 34 also includes a plurality of network interface card connectors 282–287. In the illustrated embodiment, connectors 286 and 287 accommodate a single network interface 49.

Passive midplane 34 is considered "passive" because it includes no active components which can fail. Instead, passive midplane 34 includes the necessary wiring to connect each respective web server 32 with its corresponding network interface card. Passive midplane 34 includes a printed circuit board with the appropriate printed circuitry to distribute data and power necessary for the operation of network 30. For example, passive midplane 34 distributes power to components of web server processing cards 32 and network interface cards 40, 48 and 68. Additionally, passive midplane 34 distributes data and/or communications signals between web server processing cards 32 and network interface cards 40, 48 and 68.

Passive midplane 34 provides a high-density, hot pluggable connector for as many as twenty-four web server processing cards. It consolidates power, three separate Ethernet networks and serial connections all through a single connector. Passive midplane 34 "auto-senses" web server processing cards and available slots, to allow automatic configuration of networks via remote management system 70.

Passive midplane 34 also includes a ribbon cable connector 290. Connector 290 is operable to distribute power and control signals from passive midplane 34 to articulating door 262 of chassis 38. This accommodates the operation of the LEDs and built in fans associated with articulating door 262.

Server Chassis

Figure 10:
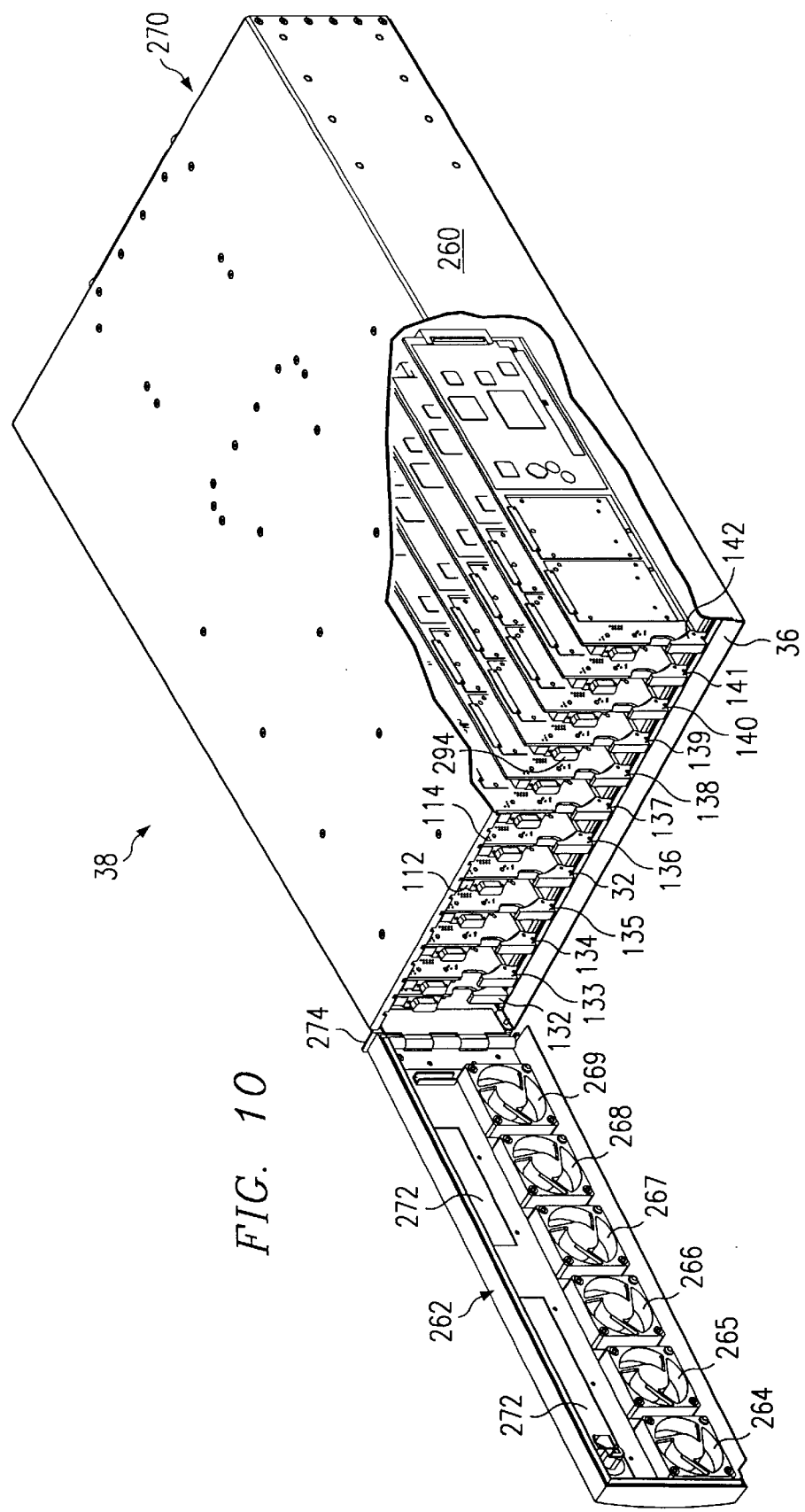
FIG. 10 is an isometric view, with portions broken away, illustrating a server chassis, in accordance with one embodiment of the present invention.
Figure 11:
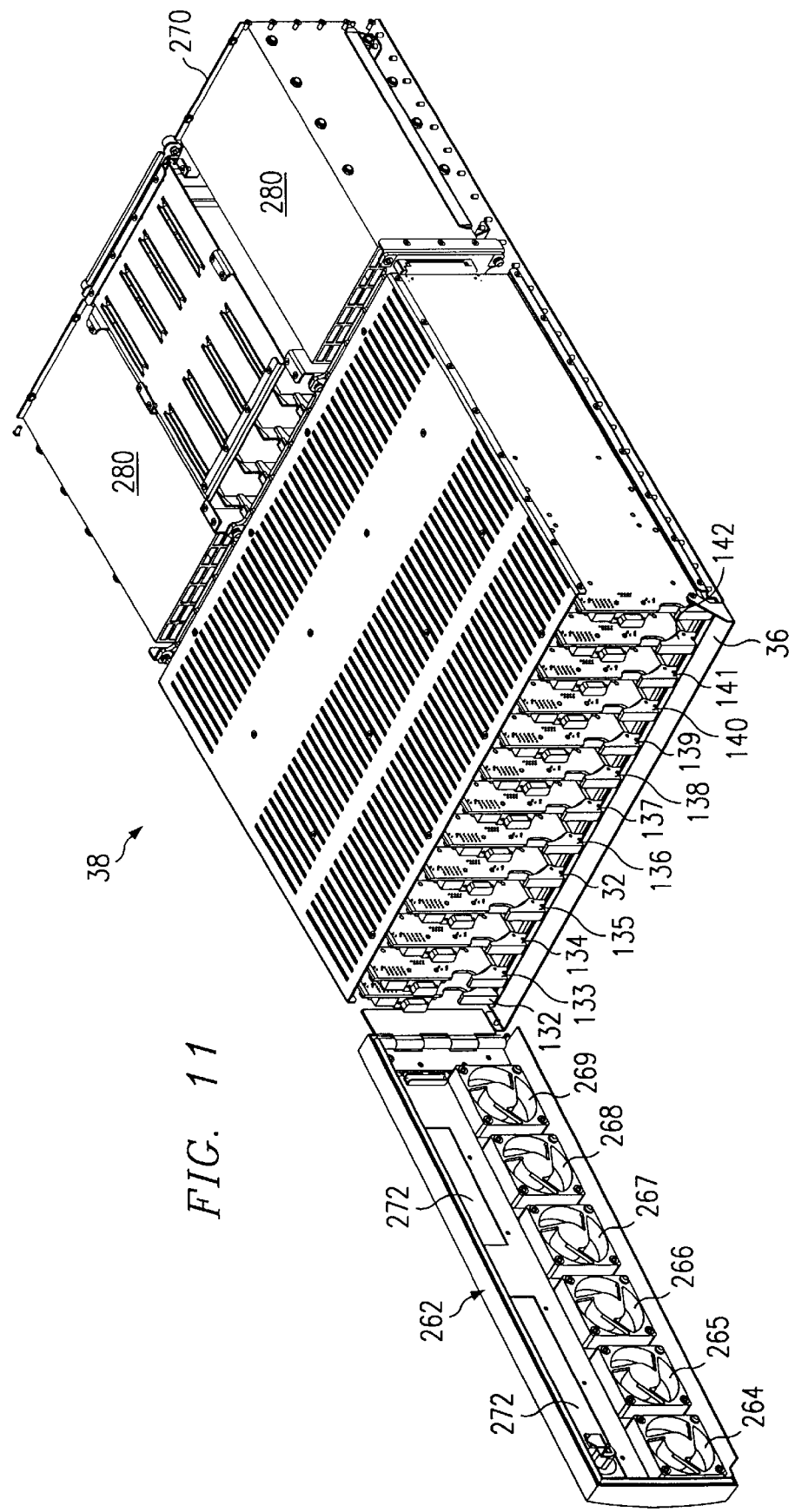
FIG. 11 is an isometric view, with portions broken away, illustrating additional components of the web server chassis of FIG. 10.
Figure 12:
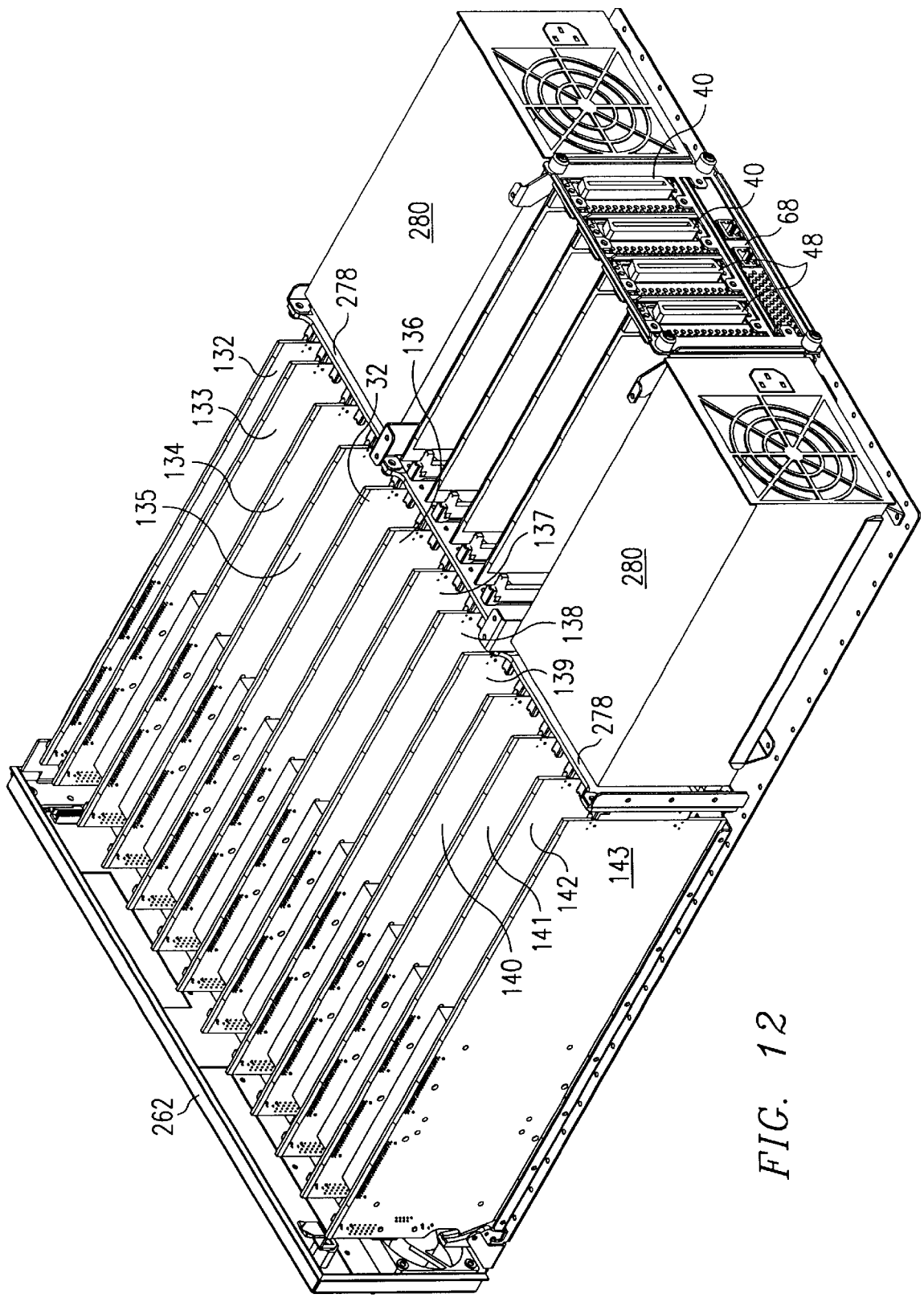
FIG. 12 is an isometric view, with portions broken away, illustrating additional components of the web server chassis of FIG. 10.

Referring now to FIGS. 10–12, server chassis 38 is illustrated in more detail. Server chassis 38 includes a box build 260 having a base 36 forming a lower portion thereof. Box build 260, of the illustrated embodiment, is fabricated from plated steel. An articulating door 262 is coupled to box build 260. Articulating door 262 and box build 260, in combination, provide the ability to protect web server processing cards 32 and 132–142 from ambient environment.

Articulating door 262 includes a plurality of box fans 264–269, mounted therein. Box fans 264–269 draw air from the ambient environment through articulating door 262, and exhaust through a back plate 270 associated with box build 262. In the illustrated embodiment, box fans 264–269 include a bank of six, three-inch fans. It will be recognized by those or ordinary skill in the art that the number, size, and configuration of fans associated with server chassis 38 may be significantly altered within the teachings of the present invention. In a particular embodiment, each box fan 264–269 will include a tachometer output having an interface coupled with passive midplane 34 such that interruption of service of any particular fan may be promptly detected.

Articulating door 262 includes a printed circuit board 272 which allows for the viewing of LED indicator lights associated with web server processing cards 32 and 132–142, by persons standing in front of articulating door 262. Recessed windows 272 include slightly "smoked" translucent material, such that the associated LED indicator lights shall be reasonably visible through the door.

The interior of articulating door 262, which faces web server processing cards 32 and 132–142 when articulating door is in the closed position, is fabricated from a metallic material. In a particular embodiment, an RF gasket may be installed between articulating door 262 and box build 260, at their interface. An injection molded plastic bezel is attached to articulating door 262 in order to achieve a leading-edge industrial design. A pair of mounting ears 274 are installed at the edges of box build 262, to provide easy installation of server chassis 38 within server rack 39.

In the illustrated embodiment, server chassis 38 measures 17.3 inches wide (without mounting ears) by 25.5 inches deep by 5.25 inches high. The environmental operating temperature is within the approximate range of 0 to 40 degrees Celsius (32 to 104 degrees Fahrenheit). Server chassis 38 may be operated at altitudes exceeding 10,000 feet above sea level.

Server chassis 38, and the associated web server processing card connector of midplane 34 contain web server processing card connectors 276 (see FIG. 8) which accommodate up to 24 web server processing cards. In the illustrated embodiment, web server processing card guides are installed at 0.7 inch center to center dimensions. Up to 12 web server processing cards 32, including optional three and one-half inch disk drives may be installed upon passive midplane 34 using every other web server processing card guide 276.

Server chassis 38 includes two power supply mounting mechanisms 278, which facilitate the installation of two load-balance, hot-swappable power supplies 280. Power supplies 280 are installed upon backplate 270 with mechanical fasteners, for example, thumbscrews. No other mounting hardware is required to attach/detach power supplies 280 to/from server chassis 38. Each power supply 280 connects to passive midplane 34 using only power supply connecting mechanisms 278.

Each power supply 280 includes enough power to operate a fully populated passive midplane 34, in the event that one of the two power supplies 280 fails. Accordingly, server chassis 38 may be offered and operated using a single power supply 280, with an optional upgrade to a second power supply.

Each power supply 280 shall be designed to be compliant with the MPS SSI power supply specification. This is a publicly released specification developed by the Server System Infrastructure organization (SSI). In a particular embodiment, power supplies 280 may include power supplies as manufactured Delta Corporation (model #DPS-450CB-1B).

Power supplies 280 are load balanced and hot swappable. Passive midplane 34 includes integrated printed circuitry which distributes power and signals to components of web server processing cards 32, 132–142, and components of the associated network interface cards 40, 48 and 68. Since each power supply 280 is sized appropriately to operate an entire chassis 38, a single power supply 280 may be removed from its associated power supply mounting mechanism 276 and replaced with a new power supply, without powering OFF server chassis 38, or affecting the operation of network 30.

Power supplies 280 are considered load balanced because they include "auto sensing" capabilities. Each power supply 280 has the ability to sense the load required of it. The printed circuitry associated with midplane 34 evenly distributes the necessary power consumption load between power supplies 280. Therefore, power supplies 280 will automatically supply one half of the necessary power (voltage) to midplane 34 when each power supply 280 is properly connected and fully operational. If service from one power supply 280 is diminished, or becomes unavailable, the other power supply 280 will sense this and supply the power necessary for passive midplane 34 to operate at full capacity. In another embodiment, power supplies 280 and midplane 34 may be provided with the printed circuitry necessary to allow power supplies 280 to communicate with one another regarding their load sharing responsibilities, and report trouble and/or diminished capacity to one another.

Power supplies 280 also include interfaces which allow management network interface card 48 and remote management system 70 to monitor voltage and temperature of each power supply 280. Accordingly, remote management system 70 includes the ability to monitor each power supply 280, and determine "trouble" situations which require intervention of the network operator or administrator. Furthermore, management network interface card 48 and remote management console 70 may use the data collected from the interface with power supplies 280 to predict an impending failure of one or more power supplies 280. Remote management console 70 may then take corrective action including without limitation, distributing the power load to another power supply 280, notifying the network administrator with a trouble alarm, and/or distributing network traffic away from the affected web server chassis 38, to another server chassis. The latter may be accomplished by mirroring the operation of the affected server chassis using back-up data stored upon another server chassis, or private network 46.

Detailed power supply specifications regarding power supplies 280, of the illustrated embodiment, are indicated below, for illustrative purposed only, and not by way of limitation:

Features
  Meet SSI MPS Standard
  Power factor correction >95%
  Automatic fan speed control
  Auto recovery after an AC power failure
  Harmonic current meet IEC1000-3-2
  Low output ripple and noise
  FanC signal meets ATX standard
  Redundancy with active current sharing
  Remote on/off control
  Over voltage, over current, over temperature, and short-circuit protection
Environmental
  Operating temperature: 0 C to 50 C
  Storage temperature: –40 C to 70 C
  MTBF: >100,000 hours
Cooling: Self-contained fan with speed control based on ambient temperature
Electrical Specifications
  Input
  Input range: 90–264 VAC
  Frequency: 47–63 Hz
  Input current: 7.6A low line input at full load
  Efficiency: >60% @ full load, nominal line
  EMI/RFI FCC Part 15J Class B; VDE 243 Level B, CISPR 22 Class B
  Output
  Maximum power: 450 watts
  Holdup time: >20 ms @ full load, nominal line @ full load, nominal line
  Rise time: <200 ms
  Overvoltage protection: +3.3V, +5V, +12V, +5Vsb
  Leakage current: <0.75 mA As previously discussed, a plurality of RJ-21 style connectors may be mounted on backplate 270 of server chassis 38. Additionally, up to two RJ-45 style connectors may also be mounted on backplate 270. These connectors are intended to facilitate daisy chaining of server chassis 38 within server rack 39.

Passive midplane 34, of server chassis 38 includes all of the power and connectivity requirements to accommodate web server processing cards 32 and 132–142. Furthermore, passive midplane 34 can accommodate an additional twelve web server processing cards.

Server chassis 38 is referred to as "hot swappable" because each web server processing card 32 and 232–243 may be replaced from within chassis 38 while chassis 38 is powered on. Chassis 38 may include as many as twelve web server processing cards having a three and one-half inch disk drive, or as many as twenty-four web server processing cards having two, two and one-half inch disk drives. In still another embodiment, web server processing card 32 may be provided without an associated disk drive.

Web server processing cards 32 each include a serial port 294 which facilitates local debugging via a laptop computer or other portable electronic device.

A parallel command bus associated with each web server processing card extends through the midplane and allows an operator of the network to perform a hardware reset (boot from LAN, boot from hard disk) of a targeted web server processing card and/or force a password reset. Serial port 294 also facilitates local debugging of web server processing cards 32 associated with web server chassis 38. For example, when private network 46 and/or management network 47 are unable to establish proper communication with web server processing cards 32 within a given server chassis 38, a local PC may be coupled with server chassis 38 in order to establish communications via serial port 294. In a particular embodiment, another serial port may be coupled directly (serially) to network management cards 40, 48 and/or 68, through passive midplane 34. Accordingly, hardware and software resets and other debugging techniques may be employed to communicate with web server processing cards 32 and network interface cards 40, 48 and 68, until network communications are restored.

Each power supply 280 includes an associated built in fan to facilitate airflow through, and cooling of, each power supply 280. Each fan includes variable speed capability. The fan speed can be adjusted from a constant speed, to a variable speed, temperature control setting. In a particular embodiment, the fans associated with power supplies 280 are used to provide airflow, and therefore cooling to web server processing cards 32, as described below.

Articulating door 262 of chassis 38 includes a chassis intrusion sensor associated with an LED board. When articulating door 262 is opened, a circuit is closed which forces the fan to a full speed setting. Each power supply 280 includes an associated interface which allows this configuration. This is done to compensate for the loss of airflow from fans 264–269 due to articulating door 262 being opened. In this manner, additional airflow through power supplies 280 at least partially compensates for the loss of airflow through fans 264–269, and additional airflow is drawn across each web server processing card 32. When articulating door 262 is closed, the fans associated with power supplies 280, return to their previous setting.

In a particular embodiment, each server chassis 38 consumes a total of 3U (1U=1.75 inches) of space. Accordingly, as many as fourteen server chassis 38 may be installed in an industry standard 42U rack. Each chassis 38 comes equipped with the ability to support redundant, load-balanced power supplies and RJ-21 style connectors which allow the consolidation of the requisite Ethernet cables to a significantly smaller number of cables than those required through the use of conventional RJ-45 connectors.

Figure 13:
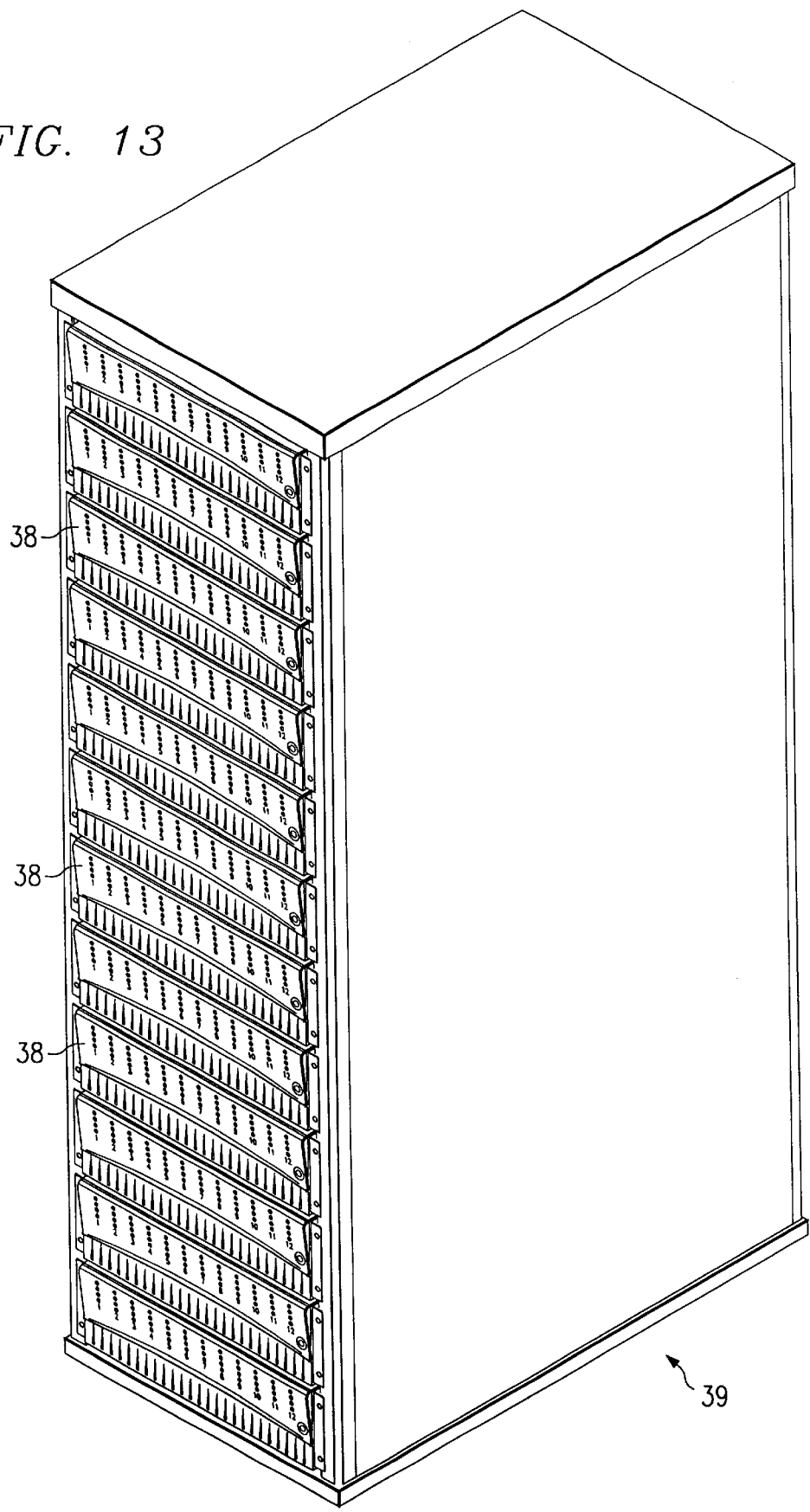
FIG. 13 is an isometric view, illustrating a web server rack, in accordance with one embodiment of the present invention.

The teachings of the present invention may be used to provide more than three hundred and thirty-six servers in a standard six foot equipment rack (See FIG. 13).

The design and configuration of web server processing cards 32 accommodate an extremely low total cost of ownership (TCO). For example, twelve or twenty-four web server processing cards 32 which are ultra-compact, low-power single board computers which share a common passive midplane, power and cable management system.

Server rack 39 is configured to provide a user friendly operating environment. For example, server rack 39 may be co-located at the physical location of an internet service provided (ISP) or an applications service provider (ASP). Moreover, due to the ease of use and operation, unsophisticated employees of the ISP/ASP can easily operate and maintain all of the components associated with web server rack 39.

Web server processing cards 32 of the present invention provide a fully scalable and inexpensive alternative to much larger, commercial web servers. There is practically no limit to the amount of web server processing cards any given ISP/ASP may add to their operations, as demand requires. Further, scalability is achieved at minimal increments. Network operators may add a single web server processing card, or an entire server rack including as many as three hundred and thirty six individual web server processing cards, as necessary. Accordingly, multiple web server processing cards operating in parallel can be deployed to achieve equal or better performance than larger commercial servers, without the significant financial investment associated with other commercial servers.

Network Management

As previously described, management network interface card 68 and remote management system 70 include the ability to monitor and manage components of network 30. Various measurements and characteristics regarding the functionality and operation of network 30 are collected, stored, analyzed and maintained using single board computer 166 of network management card 68, and remote management system 70.

In a particular embodiment, CPU 84 includes an interface which collects and stores information regarding the operation of CPU 84. This information includes "snapshot" and historical measurements including, without limitation the CPU voltage, CPU temperature, CPU wattage, and CPU utilization. Snapshot measurements include those measurements which represent the value at a given point in time. Historical information includes measurements which have been collected over time. For example, information regarding the temperature of the CPU may include the temperature at the time of the communication, or coordinates regarding the temperature of the CPU over predetermined intervals of time.

The embedded circuitry of web server processing card 32 transfers this information through passive midplane 34 to management network interface card 68. This information is captured and stored within single board computer 160. Single board computer 160 includes the hardware and software components required to collect, store and analyze this information. Single board computer 160 may also include the ability to react to information collected. For example, single board computer 160 may be pre-programmed to power off a CPU that exceeds a given temperature. Furthermore, single board computer 160 may instruct another component of network 30 to "back-up", or replicate to another component of network 30, all data, state information and functionality associated with a web server processing card having a CPU operating at an excessive temperature, and/or suffering from some other problematic malady. In fact, single board computer 160 may cause the "back-up" information associated with such a web server processing card to be uploaded to a spare web server processing card which can eventually take over all operations of the affected web server processing card. The identification and autonomous correction of such trouble and potential failures may be referred to as "predictive failover".

In this manner, single board computer 160 may autonomously detect a CPU which is about to fail and seamlessly transfer the operation of the CPU and its associated web server processing card to the spare web server processing card. All of these steps are possible without any user intervention. Also, all of these steps are possible without any service interruption, "downtime" or adverse affect upon the overall operations of network 30. A network operator may then be notified of the trouble situation, such that the affected web server processing card can be replaced with another spare.

In another embodiment, single board computer may transfer the information it collects to remote management system 70. Accordingly, at predetermined intervals, remote management system 70 downloads this information from single board computer 160 for further processing.

Remote management console 70 may then use this information in a similar manner as single board computer 160, in order to automatically identify a potential system failure, and react accordingly, without user intervention.

In a similar manner, information regarding operating disk drives may be collected by single board computer 160 and/or remote management system 70. For example, single board computer 160 may collect measurements from an interface associated with disk drive 86. Information available to single board computer 160 regarding disk drive 86 may include, without limitation, disk drive voltage, disk drive temperature, disk drive spindle speed, and/or disk drive utilization. Disk drive utilization may be made available according to bytes used and/or bytes available. In a particular embodiment, this information may be supplied in percentages, for example, 65% used, 35% available. Single board computer 160 may also collect information regarding disk drive's 86 soft error bit rate, a measure of the soft errors over a specific period of time.

The operating system associated with CPU 84 also includes information which may be transferred to single board computer 160 and/or remote management system 70.

For example, the operating system of web server processing card 32 collects information regarding disk drive utilization (bytes used, bytes available), CPU utilization (used/available), and network traffic (megabits/second). Accordingly, web server processing card 32 may transfer this information to single board computer 160 and/or remote management system 70 for use as described above.

Dynamic memory integrated circuit 88 also includes information which may be collected and analyzed by single board computer 160 and/or remote management system 70. In a particular embodiment, dynamic memory integrated circuit 88 may include an interface which transfers this information through web server processing card 32 and passive midplane 34, to single board computer 160 and/or remote management system 70. In another embodiment, this information may be obtained through the operating system. Information regarding dynamic memory integrated circuit 88 includes, without limitation the amount of memory used (bytes), the amount of memory available, the percentage of memory used, and/or the percentage of memory available.

Various other measurements and characteristics regarding the operation of components of network 30 may be monitored, collected, stored, calculated and analyzed in a similar manner. For example, each power supply 280 may include an interface which includes this information and makes it available to single board computer 160 and/or remote management system 70. Information regarding power supplies 280 includes, without limitation, the voltage, temperature and/or fan speed associated with power supplies 280.

A temperature sensor may also be installed on or near web server processing cards 32, server chassis 38, power supplies 280 and/or server rack 39. In the illustrated embodiment, each web server processing card includes an associated temperature sensor. Accordingly, the ambient temperature on or near components of web server processing cards 32 may be used to predict trouble or failure of a given web server processing card 32, or component thereof. In a particular embodiment, the temperature sensor may be located on the web server processing card side of passive midplane 34.

In a particular embodiment, single board computer 160, and/or remote management system 70 may monitor the operation of one or more box fans 264. Information regarding the box fans may include, without limitation, fan speed, voltage and/or temperature.

Additional measurements and information regarding the operation of various components of network 30 include the age of the component, the service life, history of trouble or failures and historical data regarding the life expectancy and previous trouble or failure associated with identical or similar components. All of these measurements and information may be collected, calculated or generated by components of network 30, and/or input into management system 70 and/or single board computer 160 by the network operator/administrator.

As previously discussed, management network interface 49 may be provided without single board computer 160. In this embodiment, all of the information discussed above regarding components of network 30 may be sent directly to remote management system 70. When network interface 49 is provided without single board computer 160, remote management system 70 may be configured to "sample" or collect measurements and information regarding components of network 30 at less frequent intervals, than those where a single board computer 160 is provided. This will help decrease network traffic. Accordingly, any data processing, collection of information, analysis and reaction to such information discussed with regard to either management network interface 49 or remote management system 70 may be processed, collected, stored, calculated or analyzed by one, or the other, or both.

Information collected regarding measurements and characteristics of components of network 30 may be used in a variety of ways. In a particular embodiment, this type of information may be collected and stored in a database associated with network 30, for example non-volatile storage device 72 or storage server 54. This information may be used in order for the network administrator to evaluate the performance of the system and/or predict service and maintenance needs prior to failure of a given component.

In another embodiment, remote management system 70 may use this information to establish a baseline for system performance and guidelines, or parameters that determine acceptable ranges of operation for all components of network 30. In this manner, remote management system 70 can use historical data regarding previous component failures to detect potential trouble or failures in the future. In one embodiment, remote management system 70 may monitor the performance of a particular component relative to identical or similar components within network 30, in order to detect and/or predict trouble or potential failures. In a particular embodiment, remote management system 70 may employ various techniques in order to detect or predict potential failures. For example, remote management system 70 may use logistic regression and/or neural networks to detect or predict potential failures.

Once remote management system 70 determines that one or more components of network 30 are susceptible to failure due to the information collected by remote management system 70, various actions may be taken. For example, remote management system 70 may be configured to sound an alarm or provide another form of communication to the network administrator regarding the potential failure. The identification of a component operating outside of standard, or baseline performance characteristics, which indicate potential trouble or failure, may be referred to as a "threshold trigger".

Alternatively, remote management system 70 may increase the security, or surveillance of a component that exhibits characteristics outside of the normal range. For example, remote management console may be configured to sample the CPU voltage of every CPU associated with a given server chassis, at one hour intervals. If remote management system 70 detects a CPU with a voltage outside of a predefined range, remote management system 70 may then increase the frequency of voltage measurement regarding that particular CPU. In fact, remote management console 70 may begin to monitor all components of the web server processing card which includes the affected CPU at more frequent intervals, to ensure that the performance of the web server processing card has not deteriorated due to the performance of the CPU.

Furthermore, remote management system 70 may be configured to respond to potential trouble situations in order to prevent a system failure. The active autonomous response or corrective measure to a threshold trigger by remote management system 70 and/or single board computer 160, may be referred to as a "failover event". For example, if remote management system 70 detects a temperature reading outside a predefined "normal" range for a given web server processing card, remote management system 70 may cause another component to "back-up" all data residing on the web server processing card in order to prevent the loss of such data.

If remote management system 70 determines that the affected web server processing card is likely to fail, remote management system 70 may cause a "spare" web server processing card to begin operations and transfer all of the data, state information and functionality of the affected web server processing card to the spare. Accordingly, once a potential failure is predicted, a seamless transfer of data, state information and operations from one web server processing card to another may be accomplished, without affecting the operation of network 30, and without user intervention.

Due to the configuration and operation of network 30, network operators, for example telephone companies, ISPs and/or ASPs may provide varying levels of disaster recovery to customers utilizing server chassis 38. In one embodiment, the operator will simply receive notification of a failure of a component, and repair or replace the affected component. In another embodiment, a threshold trigger may be received, indicating trouble and/or potential failure of a component, and the operator may take the corrective action necessary to continue operation of server chassis 38. In another embodiment, the operator may provide a user with predictive failover functionality, such that network 30 may detect and correct potential problems before the operation of server chassis 38 is affected. In yet another embodiment, the operator may provide a customer with a mirror web server processing card such that two web server processing cards are performing the exact same functionality, in case of the failure of one or the other. Similarly, a user may be provided with an entire "mirror" chassis to back up all of the web server cards in a particular server chassis, simultaneously.

In one embodiment, server chassis 38 may be used as a "cache farm". In other words, caching software may be provided on one or more web server processing cards which may be used as independent, or clustered caching devices.

Network 30 and all associated components are configured with minimized points of failure. Since each web server processing card includes the ability to independently detect system status information, the failure of a single web server processing card will not affect network operations.

Although the present invention has been described with several embodiments, various changes and modifications may be suggested to one of ordinary skill in the art. It is intended that the present invention encompass such changes and modifications as fall within the scope of the appended claims.

What is claimed is:

1. A system, comprising:
   a printed circuit board including a plurality of first connectors, a plurality of second connectors, a third connector, and printed circuitry;
   the plurality of first connectors being coupled with a plurality of web server processing cards;
   the plurality of second connectors being coupled with a plurality of network interface cards;
   the printed circuitry operable to couple each web server processing card with an associated one of the plurality of network interface cards;
   the third connector being coupled with a first power supply; and
   wherein the printed circuitry is operable to distribute power from the first power supply to the plurality of web server processing cards and the plurality of network interface cards.

2. The system of claim 1, wherein the printed circuit board includes a fourth connector coupled with a second power supply and wherein the printed circuitry is operable to distribute power from the second power supply to the plurality of first and second connectors.

3. The system of claim 2, wherein the printed circuitry is configured to allow the removal of one of the first and second power supplies without affecting the operation of the plurality of web server processing cards.

4. The system of claim 2, wherein the printed circuitry is configured to allow the first and second power supplies to provide power to the printed circuit board, individually.

5. The system of claim 2, wherein the printed circuitry is configured to allow the first and second power supplies to provide power to the printed circuit board in parallel.

6. The system of claim 1, further comprising a fourth connector operable to receive a ribbon cable connector.

7. A system, comprising:
   a printed circuit board having a plurality of first connectors, a second connector, and printed circuitry;
   the plurality of first connectors being coupled with a plurality of web server processing cards;
   the second connector being coupled with a network interface card; and
   the printed circuitry operable to route data communications between the plurality of web server processing cards and the network interface card.

8. The system of claim 7, wherein the printed circuitry is configured to allow the detection of the presence of one of the plurality of web server processing cards within one of the plurality of first connectors.

9. The system of claim 8, wherein the printed circuitry is configured to allow the detection of which of the plurality of first connectors include at least one of the plurality of web server processing cards.

10. The system of claim 7, further comprising a third connector coupled with a ribbon cable connector.

11. The system of claim 7, wherein the printed circuitry is configured to allow the detection of the presence of the network interface card within the second connector.

12. The system of claim 7, further comprising:
   a third connector coupled with a second network interface card; and
   wherein the printed circuitry is operable to route data communications between the plurality of web server processing cards and the first and second network interface cards.

13. The system of claim 12, wherein the printed circuitry is configured to allow the detection of which of the first and second connectors includes an associated network interface card.

14. The system of claim 7, further comprising:
a third connector coupled with a first power supply; and
wherein the printed circuitry is operable to distribute power from the first power supply to the plurality of first connectors and the second connector.

15. The system of claim 14, further comprising:
a fourth connector operable to receive a second power supply; and
wherein the printed circuitry is operable to distribute power from the second power supply to the plurality of first connectors and the second connector.

16. The system of claim 15, wherein the printed circuitry is configured to allow the removal of one of the first and second power supplies without affecting the operation of the plurality of web server processing cards.

17. The system of claim 15, wherein the printed circuitry is configured to allow the first and second power supplies to provide power to the printed circuit board individually.

18. The system of claim 15, wherein the printed circuitry is configured to allow the first and second power supplies to provide power to the printed circuit board in parallel.

19. The system of claim 7, wherein the network interface card couples the plurality of web server processing cards with a remote network.

20. The system of claim 19, wherein the remote network comprises the internet.

21. The system of claim 19, wherein the remote network comprises network attached storage.

22. The system of claim 19, wherein the remote network comprises a management network.

23. The system of claim 22, wherein the management network is operable to perform bandwidth metering of the web server processing cards.

24. The system of claim 7, wherein at least one of the plurality of first connectors comprises an ethernet connector.

25. The system of claim 24, wherein the one of the plurality of first connectors comprises an integral serial connector.

26. The system of claim 25, wherein the one of the plurality of first connectors includes an integral $I^2C$ bus.

27. The system of claim 7, wherein at least one of the plurality of first connectors comprises a gigabit RJ-45 connector.

28. The system of claim 7, wherein at least one of the plurality of first connectors includes a fiber optic connector.

29. The system of claim 7, wherein at least one of the plurality of first connectors comprises a copper gigabit connector.

30. The system of claim 7, wherein at least one of the plurality of web server processing cards includes three interface integrated circuit chip sets operable to couple the one of the web server processing cards with three independent networks.

31. The system of claim 30, wherein at least one of the three interface integrated circuit chip sets includes a 10/100 Base T network interface.

32. The system of claim 14, wherein the third connector and the first power supply are configured to provide approximately 3.3 or approximately 5.0 volt power to the plurality of web server processing cards.

33. The system of claim 7, wherein the network interface card includes a single board computer daughter card operable to execute resets of at least one of the plurality of web server processing cards.

34. The system of claim 33, wherein the resets are selected from the group consisting of hardware resets, software resets, and password resets.

35. The system of claim 14, wherein at least one of the plurality of web server processing cards, and the first power supply are hot swappable with the printed circuit board.

36. The system of claim 14, wherein the printed circuitry is operable to automatically sense the presence or absence of the first and second power supplies, and distribute the power load evenly between the first and second power supplies if the first and second power supplies are both coupled with the printed circuit board.

37. A method for providing power to a plurality of web server processing cards, comprising:
providing a plurality of first connectors on a midplane, the first connectors operable to receive a plurality of web server processing cards;
coupling each web server processing card with a respective one of the plurality of first connectors;
providing a plurality of second connectors on the midplane, the second connectors operable to receive a plurality of network interface cards;
coupling each network interface card with a respective one of the plurality of second connectors;
providing printed circuitry associated with the midplane, the printed circuitry operable to couple each first connector with an associated of the plurality of second connectors;
providing a third connector operable to receive a first power supply;
connecting the first power supply to the third connector; and
wherein the printed circuitry is operable to distribute power from the first power supply to the plurality of first and second connectors.

38. The method of claim 37, further comprising providing a fourth connector operable to receive a second power supply and wherein the printed circuitry is operable to distribute power from the second power supply to the plurality of first and second connectors.

39. The method of claim 37, further comprising coupling a fourth connector with the midplane, wherein the fourth connector is operable to receive a ribbon cable connector.

40. A method of consolidating data communications of a plurality of web server processing cards, comprising:
providing a plurality of first connectors upon a midplane printed circuit board, the first connectors operable to receive a plurality of web server processing cards;
coupling each web server processing card with a respective one of the plurality of first connectors;
providing a second connector upon the midplane printed circuit board, the second connector operable to receive a network interface card;
coupling the network interface card with the second connector; and
providing printed circuitry upon the midplane printed circuit board, the printed circuitry operable to route data communications between the plurality of first connectors and the second connector.

41. The method of claim 40, further comprising coupling a third connector with the midplane printed circuit board, the third connector operable to receive a ribbon cable connector.

42. The method of claim 40, further comprising:

coupling a third connector with the midplane printed circuit board, the third connector operable to receive a second network interface card; and wherein the printed circuitry is operable to route data communications between the plurality of web server processing cards and the first and second network interface cards.

43. The method of claim 40, further comprising coupling a third connector with the midplane printed circuit board, the third connector operable to receive a first power supply;

connecting the first power supply to the third connector; and wherein the printed circuitry is operable to distribute power from the first power supply to the plurality of first connectors and the second connector.

44. The method of claim 43, further comprising:

coupling a fourth connector with the midplane printed circuit board, the fourth connector operable to receive a second power supply;

connecting the second power supply to the fourth connector; and wherein the printed circuitry is operable to distribute power from the second power supply to the plurality of first connectors and the second connector.

* * * * *